(12) United States Patent
Matsuda

(10) Patent No.: US 6,552,768 B1
(45) Date of Patent: Apr. 22, 2003

(54) DRIVER CIRCUIT OF DISPLAY DEVICE WITH CHANNEL WIDTH DIRECTIONS OF BUFFER AND SAMPLING THIN FILM TRANSISTORS IDENTICAL WITH SCANNING DIRECTION OF A RADIATING LASER BEAM

(75) Inventor: Hiroshi Matsuda, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/276,039

(22) Filed: Mar. 25, 1999

(30) Foreign Application Priority Data

Mar. 26, 1998 (JP) .......................... 10-078774

(51) Int. Cl.[7] .......................... G02F 1/1345
(52) U.S. Cl. ................ 349/151; 349/43; 458/30
(58) Field of Search ................ 349/151, 43; 438/30, 438/198, 308, 487, 795; 117/44, 904; 257/72, 59

(56) References Cited

U.S. PATENT DOCUMENTS 5,365,875 A    11/1994  Asai et al. ................... 117/7
5,496,768 A    3/1996   Kudo ......................... 437/174
5,616,506 A    4/1997   Takemura ..................... 438/150
5,712,191 A    1/1998   Nakajima et al. ............. 437/174
5,789,763 A *  8/1998   Kato et al. .................. 257/72
5,817,548 A * 10/1998   Noguchi et al. .............. 438/160
5,824,574 A   10/1998   Yamazaki et al. ............. 438/150
5,858,822 A    1/1999   Yamazaki et al. ............. 438/166
5,981,974 A * 11/1999   Makita et al. ................ 257/72
6,057,183 A    5/2000   Koyama et al. ............... 438/166
6,096,581 A *  8/2000   Zhang et al. ................ 438/149
6,451,636 B1 * 9/2002   Segawa et al. ............... 438/166

* cited by examiner

Primary Examiner—Kenneth Parker
(74) Attorney, Agent, or Firm—Hogan & Hartson, LLP

(57) ABSTRACT

A buffer TFT (104) of a scan signal driver circuit (102) and a sampling TFT (107) of an image signal driver circuit (105) are arranged so that the channel width directions of the buffer TFT (104) and the sampling TFT (107) are identical with a scanning direction of the laser beam irradiated to an active layer of each TFT. The TFTs of the driver circuit having uniform characteristics that are not affected variation of energy of an irradiated laser can be obtained. As a result, each of the TFTs can supply uniform signals to a display pixel portion for a uniform display.

11 Claims, 5 Drawing Sheets

DRIVER CIRCUIT OF DISPLAY DEVICE WITH CHANNEL WIDTH DIRECTIONS OF BUFFER AND SAMPLING THIN FILM TRANSISTORS IDENTICAL WITH SCANNING DIRECTION OF A RADIATING LASER BEAM

BACKGROUND OF THE INVENTION

1. Field of the Invention

The present invention relates to a driver circuit of a display device. More specifically, the present invention relates to a driver circuit of a liquid crystal display (hereinafter, referred to as "LCD") using thin film transistors (hereinafter, referred to as "TFTs") for making up a scan driver circuit and an image signal driver circuit.

2. Description of the Related Art

Recently, a new TFT has been under development for use as a driver element or a pixel driver element of an active matrix type LCD, and such a TFT utilizes an active layer made of polysilicon film that is obtained by irradiating a laser beam to an amorphous silicon film.

Especially, since each of the TFTs of the driver circuit needs high electron mobility, the polysilicon having higher electron mobility than the amorphous silicon is useful as the active layer.

A TFT constituting the conventional driver circuit will be explained as follows.

FIG. 1 is a block diagram showing a conventional LCD, and FIG. 2 is a plan view showing a relationship between the position of the TFT of each driver circuit and irradiation of a laser beam. In FIG. 2, each channel of the driver circuits 102 and 105 is illustrated in a hatched box.

The driver circuit of the LCD includes a LCD panel 100, a scan signal driver circuit 102 and an image signal driver circuit 105, which are disposed on the LCD panel 100. The scan signal driver circuit 102 supplies a scan signal to the display pixel portion 108 including a plurality of display pixels 101. The image signal driver circuit 105 supplies a display signal to the display pixel portion 108. The driver circuits 102 and 105 are respectively disposed in horizontal and vertical directions of the display pixel portion 108 in the LCD, and circuits 102 and 105 are disposed in directions perpendicular to each other with respect to the display pixel portion 108 of the LCD.

The scan signal driver circuit 102 includes a shift register 103 and buffer TFTs 104 for supplying the signal from the shift register 103 to the display pixels 108. Each of the shift register 103 and the buffer TFTs 104 is made of the TFT.

The image signal driver circuit 105 includes a shift register 106 and sampling TFTs 107, each of which is constituted by the TFT.

The active layer of the above-mentioned TFT is made of polysilicon. This polysilicon is made by irradiating a laser beam 109 to an amorphous silicon film formed on a substrate. The laser beam 109, e.g., a belt-shaped excimer laser having a dimension of 500 μm×150 mm, is scanned in the direction for example from the left end to the right end of the LCD panel (in the direction of the arrow 12 in FIG. 2) by the feeding pitch of 35 μm.

However, directions of the channel width W of the TFTs 102 and 107 making up the driver circuits are different from each other.

In other words, as shown in FIG. 2, the direction of the channel width W in the scan signal driver circuit 102 is the same as the scanning direction of the laser beam shown in the arrow 12. On the other hand, the direction of the channel width W in the image signal driver circuit 105 is perpendicular to the scanning direction of the laser beam shown in the arrow 12.

If the channel width W of each TFT is 300 μm, the channel length L is 7 μm, and the feeding pitch of the laser is 35 μm, which means that the laser is scanned eight or nine times for the scan signal driver circuit 102, while only once for the image signal driver circuit 105 in direction of the channel length L of the circuit 105 since the laser is scanned in the direction of the channel length L.

Therefore, if the energy of the laser irradiated to each spot varies, the crystal size of the polysilicon formed by the irradiation may vary. In this case, characteristics of the TFT, e.g., the electron mobility, may vary.

As a result, the image signal supplied from the sampling TFT of the image signal driver circuit 105 to the display pixel portion may be not uniform among the signal lines, and unevenness may show up on the display. This is the problem to be solved.

SUMMARY OF THE INVENTION

An object of the present invention is to solve the above-mentioned problem by providing a driver circuit of the display device, which can adjust the channel width direction of the TFT of the scan signal and image signal driver circuits so that each channel of the TFTS of the driver circuits is irradiated by the laser plural times for a uniform display.

In the present invention, the channel width direction of a buffer thin film transistor of a scan signal driver circuit for supplying a scan signal to a display pixel is identical with the channel width direction of a sampling thin film transistor of an image signal driver circuit for supplying an image signal to the display pixel.

In addition, the channel width directions of the buffer thin film transistor of the scan signal driver circuit for supplying the scan signal to the display pixel and the sampling thin film transistor of the image signal driver circuit for supplying the image signal to the display pixel are identical with a scanning direction of a laser beam irradiated to an active layer of the thin film transistors.

In another aspect, the present invention provides a driver circuit of a display device having display pixels arranged in a matrix on a substrate. A scan signal driver circuit for supplying a scan signal to the display pixels extends along one of adjacent sides on the peripheral area of the substrate. An image signal driver circuit for supplying an image signal to the display pixels extends along the other side of the adjacent sides on the peripheral area of the substrate. The channel width direction of the buffer thin film transistor of the scan signal driver circuit is identical with the channel width direction of the sampling thin film transistor of the image signal driver circuit.

In another aspect of the present invention, the channel width directions of the buffer thin film transistor of the scan signal driver circuit and the sampling thin film transistor of the image signal driver circuit are identical with the scanning direction of the laser beam irradiated to the active layer of the thin film transistor in the above-mentioned driver circuit.

In addition, a plurality of the sampling thin film transistors whose channel width direction is identical with the extending direction of the image signal driver circuit is arranged in parallel in the direction away from the display pixels to make up one unit. A plurality of the units are arranged in the extending direction of the image signal driver circuit.

Furthermore, a plurality of the sampling thin film transistors whose channel width direction is identical with the extending direction of the scan signal driver circuit are arranged in parallel in the direction away from the display pixels to make up one unit. A plurality of the units are arranged in the extending direction of the scan signal driver circuit.

Furthermore, the channel width directions of the thin film transistors making up a scan signal side shift register and an image signal side shift register are identical with the scanning direction of a laser beam irradiated to an active layer of the thin film transistors.

In another aspect, the present invention provides a driver circuit of the display device that is a liquid crystal display device performing display by driving a liquid crystal disposed between a pair of substrates. On one of the substrates, pixel electrodes constituting the display pixels, display thin film transistors performing in accordance with the scan signal to supply the image signal to the pixel electrodes, a scan signal driver circuit for supplying the scan signal to the pixel electrodes, and an image signal driver circuit for supplying the image signal to the pixel electrodes are formed. An active layer including the channels of the display thin film transistors, the buffer thin film transistors of the scan signal driver circuit and the sampling thin film transistors of the image signal driver circuit is made of a polycrystalline film formed by irradiating the laser beam to an amorphous semiconductor film while scanning in a predetermined direction.

In another aspect of the present invention, the channel width direction of the buffer thin film transistor of the scan signal driver circuit and the channel width direction of the sampling thin film transistor of the image signal driver circuit are identical with the extending direction of the image signal driver circuit on the substrate in the above-mentioned driver circuit.

According to the above-mentioned driver circuit of the display device, TFTs of the driver circuit having uniform characteristics without influence of variation of energy of an irradiated laser can be obtained. As a result, each of the TFTs can supply uniform signals to a display pixel portion for a uniform display.

In addition, as mentioned above, a plurality of thin film transistors (sampling or buffer thin film transistors) are arranged in the direction away from the display pixels so as to make up one unit, and a plurality of the units are arranged in the extending direction of the driver circuit. With this layout, the channel width directions of the two driver circuits are identical with each other, so that the increase of the area for the driver circuit can be minimized.

DESCRIPTION OF THE PREFERRED EMBODIMENT

Hereinafter, a drive circuit of the display device according to the present invention will be explained in detail with reference to the drawings.

Figure 1:
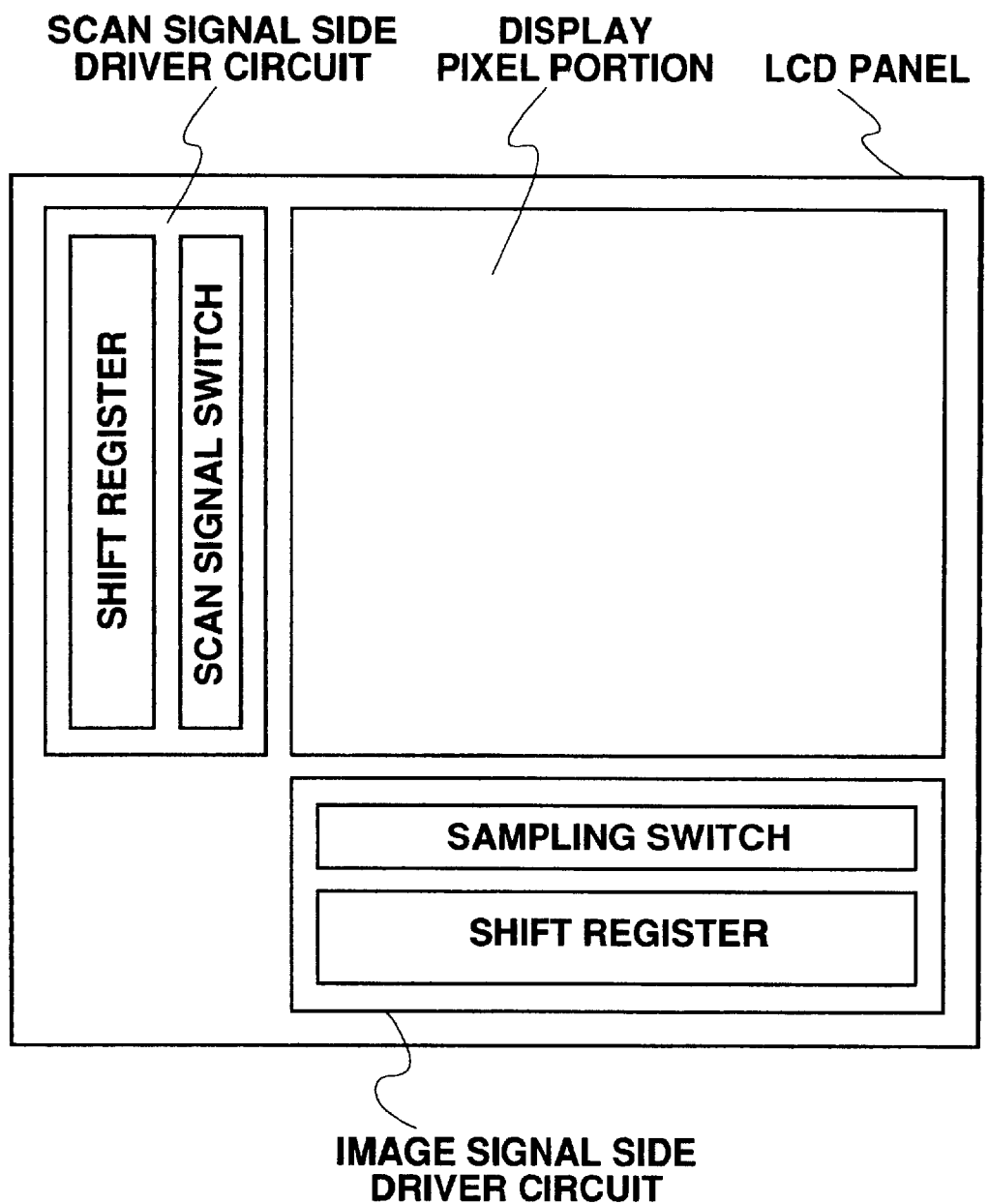
FIG. 1 is a block diagram of a conventional LCD.
Figure 2:
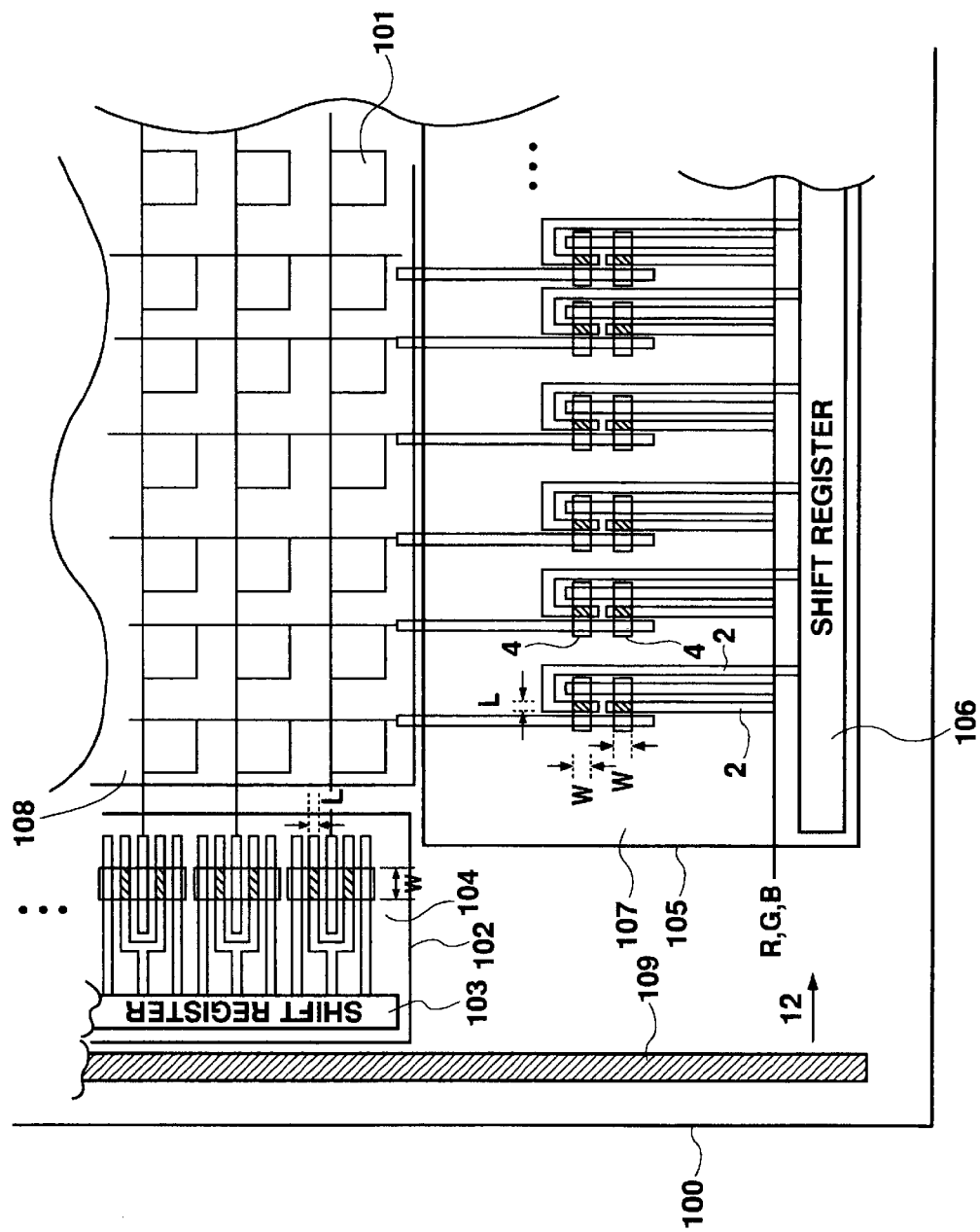
FIG. 2 is a plan view showing driver circuits in the conventional LCD.
Figure 3:
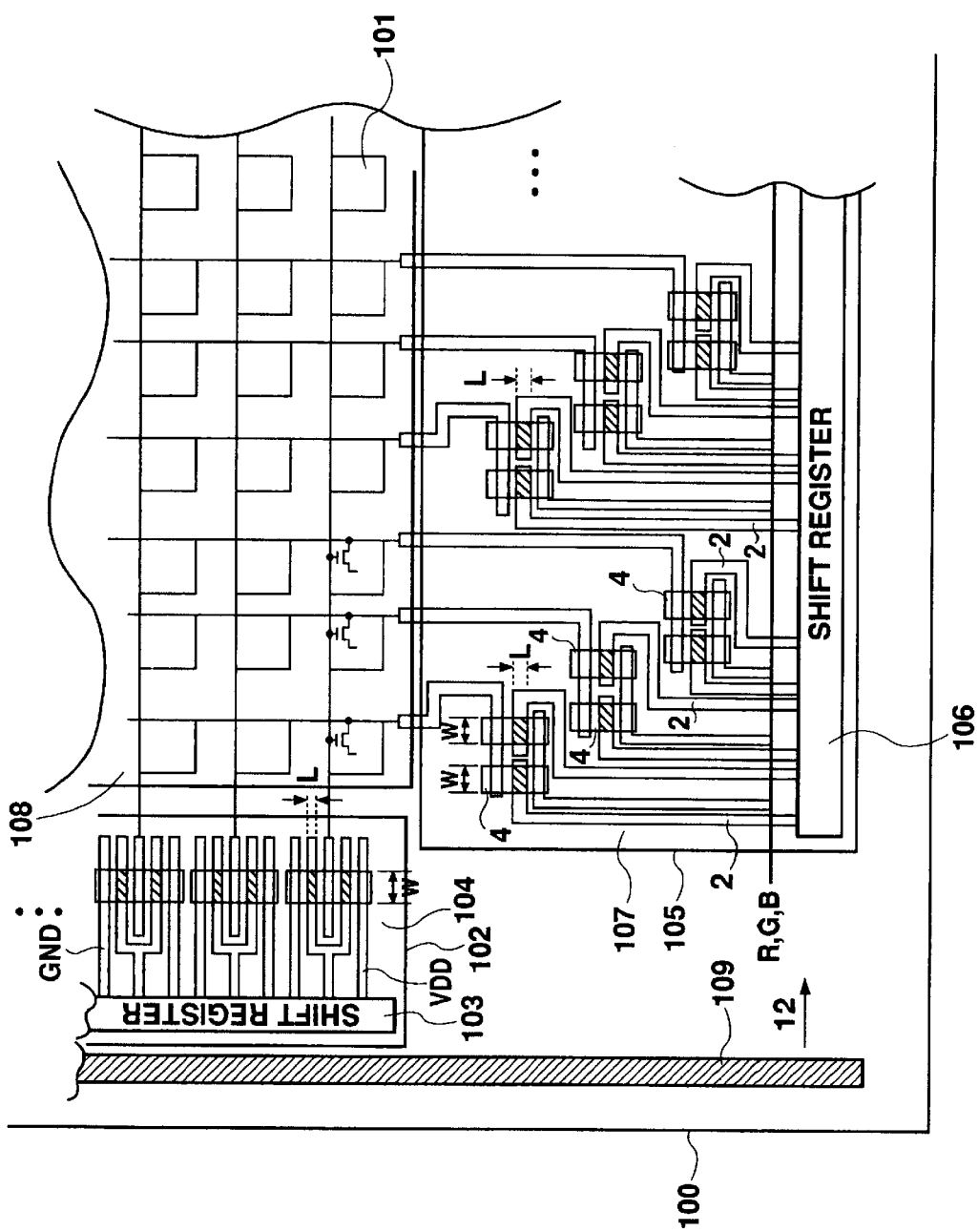
FIG. 3 is a block diagram of driver circuits in a LCD according to the embodiment of the present invention.
Figure 4:
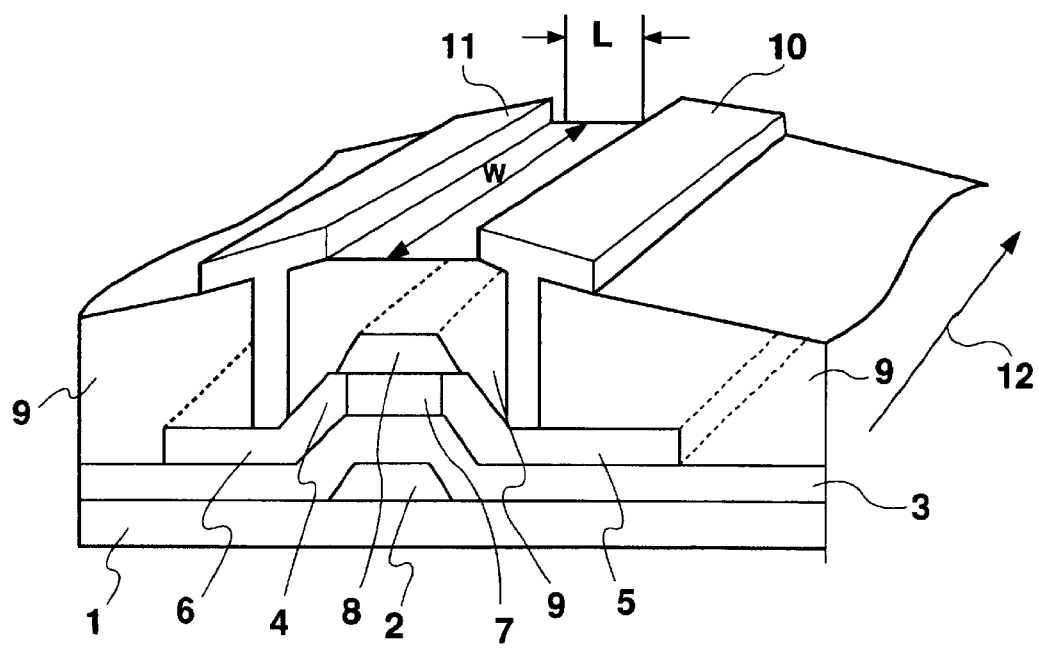
FIG. 4 is a perspective view of a TFT showing the embodiment of the present invention.

FIG. 3 shows a plan view of the driver circuit of a LCD according to the present invention. FIG. 4 shows a perspective view of one of the TFTs shown in FIG. 3. In FIG. 3, a channel region of each TFT of the driver circuit is shown as a hatched area, the channel width is denoted by W, and the channel length is denoted by L.

The scan signal driver circuit 102 is located in the left side of the display pixel portion 108 of the LCD panel 100 and extends from the upper portion to the lower portion in the layout shown in FIG. 3. The scan signal driver circuit 102 includes a shift register 103 and buffer TFTs 104.

The buffer TFT 104 has an inverter structure. A signal from the shift register 103 is supplied to a gate electrode of the buffer TFT 104, which supplies the gate signal to the display pixel portion 108 by selecting the voltage VDD connected to the power source of the shift register 103 and the voltage GND connected to the ground.

The image signal driver circuit 105 is located in the lower side of the display pixel portion 108 of the LCD panel 100 and extends from the left portion to the right portion in the layout shown in FIG. 3. The image signal driver circuit 105 includes a shift register 106 and image signal sampling TFTs 107. Each of them is made of TFT. The gate electrode of the sampling TFT 107 is provided with a signal from the shift register 106, the drain of the sampling TFT 107 is provided with an image signal (e.g., R, G, B signals), and the image signal is supplied to the display pixel portion 108 through the channel.

The channel width W direction of the buffer TFT 104 of the scan signal driver circuit 102 is arranged in the same direction as the scanning direction 12 of the irradiated laser. In other words, as shown in FIG. 3, if the scanning direction 12 of the laser is the direction from the left end to the right end in the figure, the channel width W of each TFT 104 is arranged so as to extend from the left to the right direction. In addition, the channel width W of each sampling TFT 107 of the image signal driver circuit 105 is arranged in the same direction as the channel width W direction of the TFT 104 of the scan signal wire side. Namely, the channel width W of each sampling TFT 107 is the same as the scanning direction 12 of the laser.

As shown in FIG. 4, the gate electrode 2 made of a refractory metal (high melting point metal) such as Cr or Mo is formed on the insulating substrate 1 made of a crystal glass or a non-alkali glass. A gate insulating film 3 made of a SiN film and a $SiO_2$ film is then formed on the gate electrode 2. On the gate insulating film 3, the amorphous silicon is deposited to form an active layer 4. The excimer laser is irradiated to the amorphous silicon, which is converted to polysilicon.

The active layer 4 is provided with a channel 7 disposed above the gate electrode 2, and source 5 and drain 6 that are formed by ion doping at both sides of the channel 7.

On the channel 7, there is a stopper 8 made of $SiO_2$ film acting as a mask covering the channel 7 to prevent ions from entering the channel 7 during the ion doping for making the source 5 and the drain 6.

Covering the entire surface of the gate insulating film 3, the active layer 4 and the stopper 6, an interlayer film 9 is formed, which includes a $SiO_2$ film, a SiN film and a $SiO_2$ film deposited in this order. In addition, a metal such as Al is filled into contact holes formed in the interlayer film 9 at the position corresponding to the source 5 and the drain 6, to form the source electrode 10 and the drain electrode 11.

Next, the method for irradiating the laser to the amorphous silicon film to convert it into the polysilicon film will be described.

Figure 5:
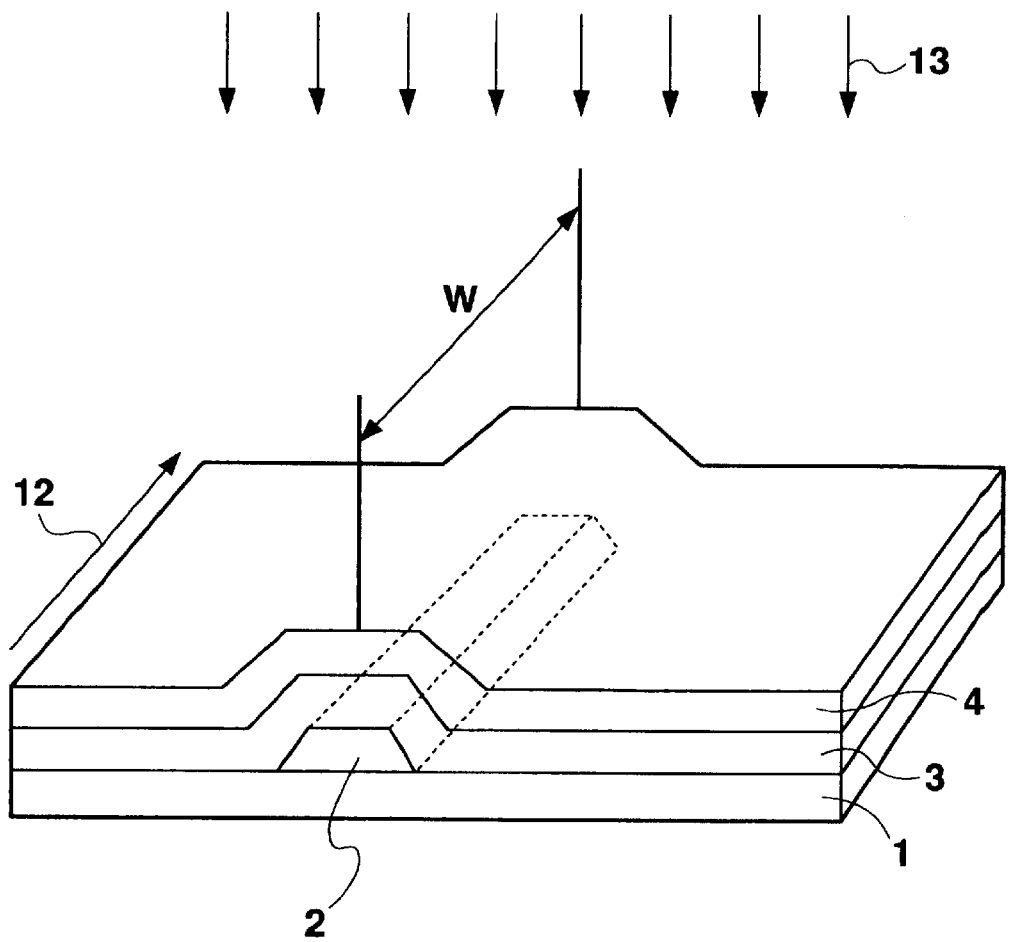
FIG. 5 is a perspective view showing a method of laser irradiation according to the present invention.

FIG. 5 shows the method of laser irradiation to the active layers of the buffer TFTs of the scanning signal side and the sampling TFTs of the image signal side.

The amorphous silicon film that is the active layer 4 is formed on the gate insulating film 3 after forming the gate electrode 2 on the glass substrate 1 and forming the gate insulating film 3 on the gate electrode 2. The excimer laser 13 is irradiated to the amorphous silicon film to convert it into the polysilicon.

On this occasion, the excimer laser 13 is repeatedly scanned in the direction in which the gate electrode 2 extends, i.e., the channel width W direction, at a pitch of 35 μm for example, as shown in the arrow 12, so as to convert the amorphous silicon into the polysilicon at the irradiated spot.

If the width of the excimer laser in the channel width W direction is 40 μm, and the channel width W of the TFT is 300 μm, for example, the laser irradiation to the channel is performed eight or nine times.

As mentioned above, the channel width W directions of the TFT are arranged in the same direction for the buffer TFT 104 and the sampling TFT 107. In addition, the laser scanning direction 12 is set identical with the channel width W directions. Therefore, the laser beam 109 is irradiated to the amorphous silicon film of each of the TFTs multiple times. As a result, the characteristic of a TFT is not deteriorated even if the energy of the laser varies during the multiple irradiation. Thus, the signal transmission to the display pixels 101 becomes uniform in the same manner as other TFTS.

Consequently, a uniform display can be obtained in a LCD.

In the above-mentioned embodiment, the scanning direction of the laser irradiation is the direction from the left end to the right end in FIG. 3. However, if the scanning direction of the laser irradiation is the direction from the upper side to the lower side in FIG. 3, the channel width W directions of the buffer TFT 104 and the sampling TFT 107 of each driver circuit are arranged in the direction from the upper side to the lower side.

The sampling TFTs 107 are arranged as shown in FIG. 3, so that the channel width W direction of the sampling TFT 107 is identical with the extending direction of the image signal driver circuit. Three of the TFTs 107 are disposed in parallel in a predetermined pitch in the direction being away from the display pixel, so that the wire patterns for supplying the signal from the shift register 106 to the sampling TFTs 107 are separated from each other with as wide a pitch as possible. The three of the TFTs 107 are arranged as one unit in parallel with the extending direction of the image signal driver circuit 105 in accordance with the number of the display pixels 101. If there are 720 display pixels in one line of the scanning signal line direction for example, 240 units are disposed in the direction from the lateral direction in FIG. 3. The number of TFTs in one unit and the number of arranged units depend on the size of the TFT (i.e., the channel width and the channel length).

Though the above-mentioned embodiment is explained in the case of the sampling TFT of the image signal driver circuit, the present invention can be applied to the buffer TFT of the scan signal driver circuit.

With the above-mentioned arrangement, space for signal wires from the shift register or from the sampling TFTs to the display pixels is secured, and sufficient channel width can be obtained. Thus, a sampling TFT having a sufficient electric current capacity for supplying the image signal to the display pixel can be obtained.

In the above-mentioned embodiment, the channel width W directions of the scanning signal side buffer TFT and the image signal side sampling TFT are identical with the scanning direction of the laser. However, the present invention is not limited to this embodiment. If the channel width W directions of the TFTs of the scanning signal side and the image signal side shift resisters are identical with the scanning direction of the laser, a similar effect can be obtained.

In addition, if the channel width W directions of all TFTs of the scan signal driver circuit and the image signal driver circuit are identical with the scanning direction of the laser, a similar effect can be obtained.

Generally speaking, the number of buffer thin film transistors in the scan signal driver circuit needs to be the same number as the number of display pixels 101 in the column (V) direction of the matrix arrangement. The number of sampling thin film transistors in the image signal driver circuit needs to be the same number as the number of display pixels 101 in the row (H) direction of the matrix arrangement. Therefore, if it is attempted to make the channel width W directions of the buffer thin film transistor 104 and the sampling thin film transistor 107 identical with each other, it may become difficult for one of the thin film transistors to be simply arranged along the vertical or horizontal direction of the pixels. However, in the above-mentioned embodiment, as shown in FIG. 3, a plurality of thin film transistors are arranged in the direction away from the display pixels 101 to form one unit, and a plurality of the units are arranged in the extending direction of the driver circuit. Therefore, the increase of the area of the driver circuit can be minimized by setting the channel width W directions of the two kinds of driver circuits identical with each other. In addition, in a color display device, since three display pixels (R, G and B pixels) make up one color display, three sampling thin film transistors 107 that supply the image signals to these three pixels can be set as one unit as shown in FIG. 3. Thus, the designing of the circuit can be simplified.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A driver circuit of a display device having display pixels arranged in a matrix on a substrate, the driver circuit comprising:

buffer thin film transistors of a scan signal driver circuit for supplying a scan signal to the display pixels; and sampling thin film transistors of an image signal driver circuit for supplying an image signal to the display pixels, wherein channel width directions of the buffer thin film transistor and the sampling thin film transistor are identical with each other;

a plurality of the sampling thin film transistors whose channel width direction is identical with the extending direction of the image signal driver circuit are arranged in parallel in the direction away from the display pixels to make up one unit, a plurality of the units are arranged in the extending direction of the image signal driver circuit, and each sampling thin film transistor located closest to the display pixels is included in a separate unit.

2. A driver circuit of a display device having display pixels arranged in a matrix on a substrate, the driver circuit comprising:

buffer thin film transistors of a scan signal driver circuit for supplying a scan signal to the display pixels; and sampling thin film transistors of an image signal driver circuit for supplying an image signal to the display pixels, wherein channel width directions of the buffer thin film transistor and the sampling thin film transistor are identical with each other;

a plurality of the buffer thin film transistors whose channel width direction is identical with the extending direction of the scan signal driver circuit are arranged in parallel in the direction away from the display pixels to make up one unit, a plurality of the units are arranged in the extending direction of the scan signal driver circuit, and each sampling thin film transistor located closest to the display pixels is included in a separate unit.

3. The driver circuit according to claim 1, wherein the display device is a liquid crystal display device that performs display by driving a liquid crystal disposed between a pair of substrates.

4. A driver circuit of a display device having display pixels arranged in a matrix on a substrate, the driver circuit comprising:

buffer thin film transistors of a scan signal driver circuit for supplying a scan signal to the display pixels; and sampling thin film transistors of an image signal driver circuit for supplying an image signal to the display pixels, wherein channel width directions of the buffer thin film transistor and the sampling thin film transistor are identical with a scanning direction of a laser that is irradiated to an active layer of the thin film transistor;

a plurality of the sampling thin film transistors whose channel width direction is identical with the extending direction of the image signal driver circuit are arranged in parallel in the direction away from the display pixels to make up one unit, a plurality of the units are arranged in the extending direction of the image signal driver circuit, and each sampling thin film transistor located closest to the display pixels is included in a separate unit.

5. The driver circuit according to claim 4, wherein the display device is a liquid crystal display device that performs display by driving a liquid crystal disposed between a pair of substrates, on one of which are formed pixel electrodes constituting the display pixels, display thin film transistors performing in accordance with the scan signal to supply the image signal to the pixel electrodes, a scan signal driver circuit for supplying the scan signal to the pixel electrodes, and an image signal driver circuit for supplying the image signal to the pixel electrodes, and wherein an active layer including the channels of the display thin film transistors, the buffer thin film transistors of the scan signal driver circuit and the sampling thin film transistors of the image signal driver circuit is made of a polycrystalline film formed by irradiating the laser beam to an amorphous semiconductor film while scanning in a predetermined direction.

6. A driver circuit of a display device having display pixels arranged in a matrix on a substrate, the driver circuit comprising:

buffer thin film transistors of a scan signal driver circuit for supplying a scan signal to the display pixels; and sampling thin film transistors of an image signal driver circuit for supplying an image signal to the display pixels, wherein channel width directions of the buffer thin film transistor and the sampling thin film transistor are identical with a scanning direction of a laser that is irradiated to an active layer of the thin film transistor;

a plurality of the buffer thin film transistors whose channel width direction is identical with the extending direction of the scan signal driver circuit are arranged in parallel in the direction away from the display pixels to make up one unit, a plurality of the units are arranged in the extending direction of the scan signal driver circuit, and each sampling thin film transistor located closest to the display pixels is included in a separate unit.

7. A driver circuit of a display device performing display by driving a plurality of display pixels by scan signals and image signals, wherein channel width directions of thin film transistors constructing a scan signal driver circuit and an image signal driver circuit are identical with the scanning direction of the laser beam irradiated to an active layer of the thin film transistors.

8. A driver circuit of a display device having display pixels arranged in a matrix on a substrate, the driver circuit comprising:

a scan signal driver circuit for supplying a scan signal to the display pixels, the scan signal driver circuit extending along one of adjacent sides on the peripheral area of the substrate;

an image signal driver circuit for supplying an image signal to the display pixels, the image signal driver circuit extending along the other of the adjacent sides on the peripheral area of the substrate, wherein the channel width direction of the buffer thin film transistor of the scan signal driver circuit is identical with the channel width direction of the sampling thin film transistor of the image signal driver circuit; and wherein the sampling thin film transistors of the image signal driver circuit are arranged so that the channel width direction thereof is identical with the extending direction of the image signal driver circuit, a plurality of sampling thin film transistors are arranged in the direction away from the display pixels so as to make up one unit, a plurality of the units are arranged in the extending direction of the image signal driver circuit, and each sampling thin film transistor located closest to the display pixels is included in a separate unit.

9. A driver circuit of a display device having display pixels arranged in a matrix on a substrate, the driver circuit comprising:

a scan signal driver circuit for supplying a scan signal to the display pixels, the scan signal driver circuit extending along one of adjacent sides on the peripheral area of the substrate and;

an image signal driver circuit for supplying an image signal to the display pixels, the image signal driver circuit extending along the other of the adjacent sides on the peripheral area of the substrate, wherein the channel width direction of the buffer thin film transistor of the scan signal driver circuit is identical with the channel width direction of the sampling thin film transistor of the image signal driver circuit;

the channel width directions of the buffer thin film transistor of the scan signal driver circuit and the sampling thin film transistor of the image signal driver circuit are identical with the scanning direction of the laser beam irradiated to the active layer of the thin film transistor, and each sampling thin film transistor located closest to the display pixels is included in a separate unit.

10. The driver circuit according to claim 9, wherein the display device is a liquid crystal display device that performs display by driving a liquid crystal disposed between a pair of substrates, on one of which are formed pixel electrodes constituting the display pixels, display thin film transistors working in accordance with the scan signal to supply the image signal to the pixel electrodes, a scan signal driver circuit for supplying the scan signal to the pixel electrodes, and an image signal driver circuit for supplying the image signal to the pixel electrodes, and wherein an active layer including the channels of the display thin film transistors, the buffer thin film transistors of the scan signal driver circuit and the sampling thin film transistors of the image signal driver circuit is made of a polycrystalline film formed by irradiating the laser beam to an amorphous semiconductor film while scanning in a predetermined direction.

11. The driver circuit according to claim 9, wherein the channel width direction of the buffer thin film transistor of the scan signal driver circuit and the channel width direction of the sampling thin film transistor of the image signal driver circuit are identical with the extending direction of the image signal driver circuit on the substrate.

\* \* \* \* \*